United States Patent [19]

Dawson et al.

[11] Patent Number: 4,683,591
[45] Date of Patent: Jul. 28, 1987

[54] PROPORTIONAL POWER DEMAND AUDIO AMPLIFIER CONTROL

[75] Inventors: Brian D. Dawson; James R. Leacock, both of Lincoln, Nebr.

[73] Assignee: Emhart Industries, Inc., Indianapolis, Ind.

[21] Appl. No.: 728,408

[22] Filed: Apr. 29, 1985

[51] Int. Cl.⁴ ............................................. H03F 21/00
[52] U.S. Cl. .......................................... 381/85; 381/58
[58] Field of Search ...................... 381/80, 81, 82, 84, 381/85, 111, 120, 123, 24; 330/124 R

[56] References Cited

U.S. PATENT DOCUMENTS

4,468,806  8/1984  Gaulden ................................. 381/85
4,481,660 11/1984  de Koning ............................. 381/84

Primary Examiner—Gene Z. Rubinson
Assistant Examiner—L. C. Schroeder
Attorney, Agent, or Firm—Robert F. Meyer; Carl A. Forest

[57] ABSTRACT

A proportional audio power demand system has a plurality of speaker banks and a plurality of amplifiers. Each speaker bank has at least one speaker. The system also has at least one audio channel and each amplifier and speaker bank can be selectively coupled to the audio channel. The system includes a controller which causes at least one amplifier and speaker bank to be coupled to the channel. The system also includes a sensor which senses the power output of the amplifier. The sensor is coupled to the amplifier and controller and the controller responds to the sensed power output of the amplifier to determine when to cause an additional amplifier to be coupled to the channel.

6 Claims, 6 Drawing Figures

PROPORTIONAL POWER DEMAND AUDIO AMPLIFIER CONTROL

This invention relates to audible annunciator systems and more particularly to annunciator systems having multiple audio channels which utilize audio amplifiers.

High-rise buildings which are constructed in accordance with modern day safety practices will have life safety audio systems installed in the buildings. These systems detect unsafe conditions, such as fires, and provide alarms to alert building personnel when and where appropriate. These high-rise life safety systems will typically have multiple audio channels and will utilize multiple audio amplifiers. Each audio channel would be coupled to a certain type of audio source, such as a source of prerecorded messages, a source of live voice, or a tone source. One or more audio sources can be selected to provide the audio signal or signals which are broadcast.

A typical high-rise life safety audio system which has heretofore been available utilizes a bank of audio amplifiers for each audio channel. For example, if the system has three audio channels, three banks of audio amplifiers would be needed for the system. Each individual amplifier bank consists of a number of separate audio amplifiers with their outputs summed together to provide adequate audio power to activate each and every speaker in the structure. Any time an audio channel is used to send out a signal, every amplifier in the bank coupled to the channel is energized to provide an audio signal to the speakers which are coupled to the channel.

These systems typically permit selection of the speakers to be coupled to the system. Therefore, when any given audio channel is being used to provide a signal, it is possible that any number of speakers could be connected to the system ranging from one speaker to every speaker in the building. However, regardless of the number of speakers coupled to the channels, every amplifier in the amplifier bank dedicated to the channel is used to activate the speakers connected to the channel.

The use of banks of audio amplifiers wherein one amplifier bank is dedicated to each channel results in a system having an excessive amount of audio amplification available. Since the system is often used to provide a signal to only some of the available speakers, only a portion of the capacity of each amplifier in the bank is utilized.

It is an objective of this invention to eliminate the necessity for redundant amplifier banks for multiple channel systems using audio amplifiers.

It is another object of this invention to efficiently allocate audio amplification resources to the audio channels according to the power needed on each channel.

In accordance with this invention, a proportional audio power demand system has a plurality of audio amplifiers and a plurality of speaker banks. Each speaker bank includes at least one speaker. The system further includes at least one audio channel and means for selectively coupling each amplifier to the channel. The system also includes means for coupling each speaker bank to the channel and has means for controlling the amplifier and speaker bank coupling means to cause at least one amplifier and one speaker bank to be coupled to the channel. Further, the system includes means for sensing the power output of the amplifier, means for coupling the sensing means to the control means and to the amplifier, means for coupling the amplifier coupling means to the control means, and means for coupling the speaker bank coupling means to the control means. The control means includes means for determining when to cause the amplifier coupling means to couple an additional amplifier to the channel based upon the sensed audio power.

Additional features and advantages of the invention will become apparent to those skilled in the art upon consideration of the following detailed description of a preferred embodiment exemplifying the best mode of carrying out the invention as presently perceived. The detailed description particularly refers to the accompanying figures in which:

Figure 1:
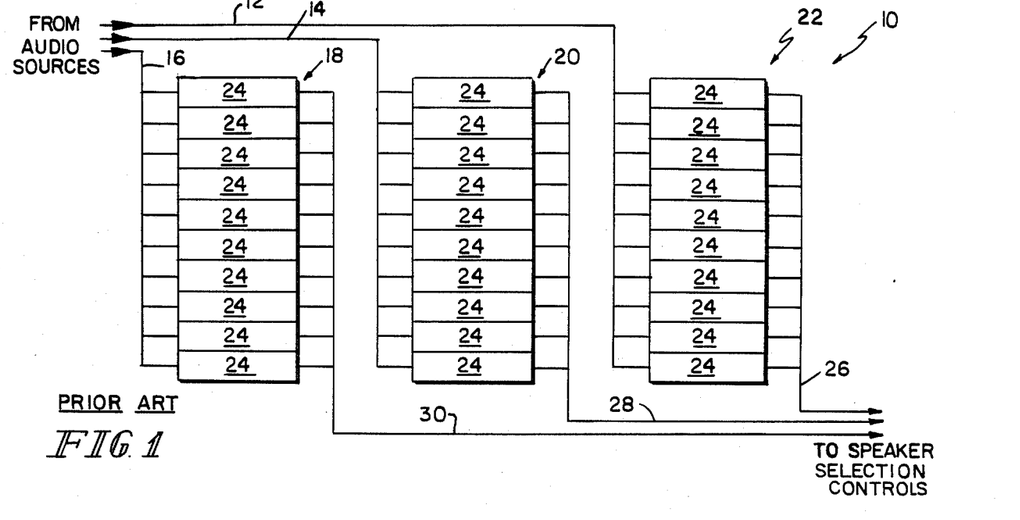
FIG. 1 is a block diagram of a prior audio annunciator system.

Referring to FIG. 1, a prior art audible annunciator system using audio amplifiers and having multiple audio channels is shown in block diagram form. An annunciator system 10 includes an audio input channel 12, an audio input channel 14, and an audio input channel 16. Channel 12 is illustratively coupled to a tone source, channel 14 is illustratively coupled to a source of live voice such as a microphone, and channel 16 is illustratively coupled to a source of pre-recorded voice messages, none of which are shown. Channel 12 is connected to an amplifier bank 22 which comprises a plurality of amplifiers 24. Each amplifier 24 has an input which is connected to channel 12.

Channel 14 is connected to an amplifier bank 20 which also includes a plurality of amplifiers 24, each having an input connected to channel 14. Channel 16 is connected to a speaker bank 18 which also includes a plurality of amplifiers 24, each having an input connected to channel 16.

The outputs of each of the amplifiers 24 of speaker bank 22 are coupled together to provide audio output channel 26. Output channel 26 carries an amplified audio signal produced by amplifying the audio signal on input channel 12. The outputs of each of the amplifiers 24 of speaker bank 20 are also coupled together and provide audio output channel 28. Channel 28 carries an amplified audio signal produced by amplifying the audio signal on input channel 14. The output of each of the amplifiers 24 of speaker bank 18 are also coupled together to provide audio output channel 30. Channel 30 carries an amplified audio signal produced by amplifying the audio signal on input channel 16.

Output channels 26, 28, 30 are each coupled to a speaker selection control (not shown) which permits each of the channels 26, 28, 30 to be selectively connected to the speakers distributed throughout the area served by the annunciator system, such as a high-rise building. Typically, each channel 26, 28, 30 could be selectively coupled to any or all the speakers in the high-rise building.

This type of audio annunciator system makes use of a dedicated bank of audio amplifiers for each audio channel. When any particular channel is being used to actuate one or more speaker, each amplifier in the amplifier bank serving that channel is used to actuate the speakers which have been connected to that particular channel. Therefore, only a portion of the capacity of each amplifier, and in many cases, only a minor portion of the capacity of each amplifier, is used at any one time to amplify the audio input signal to actuate the speakers.

Figure 2:
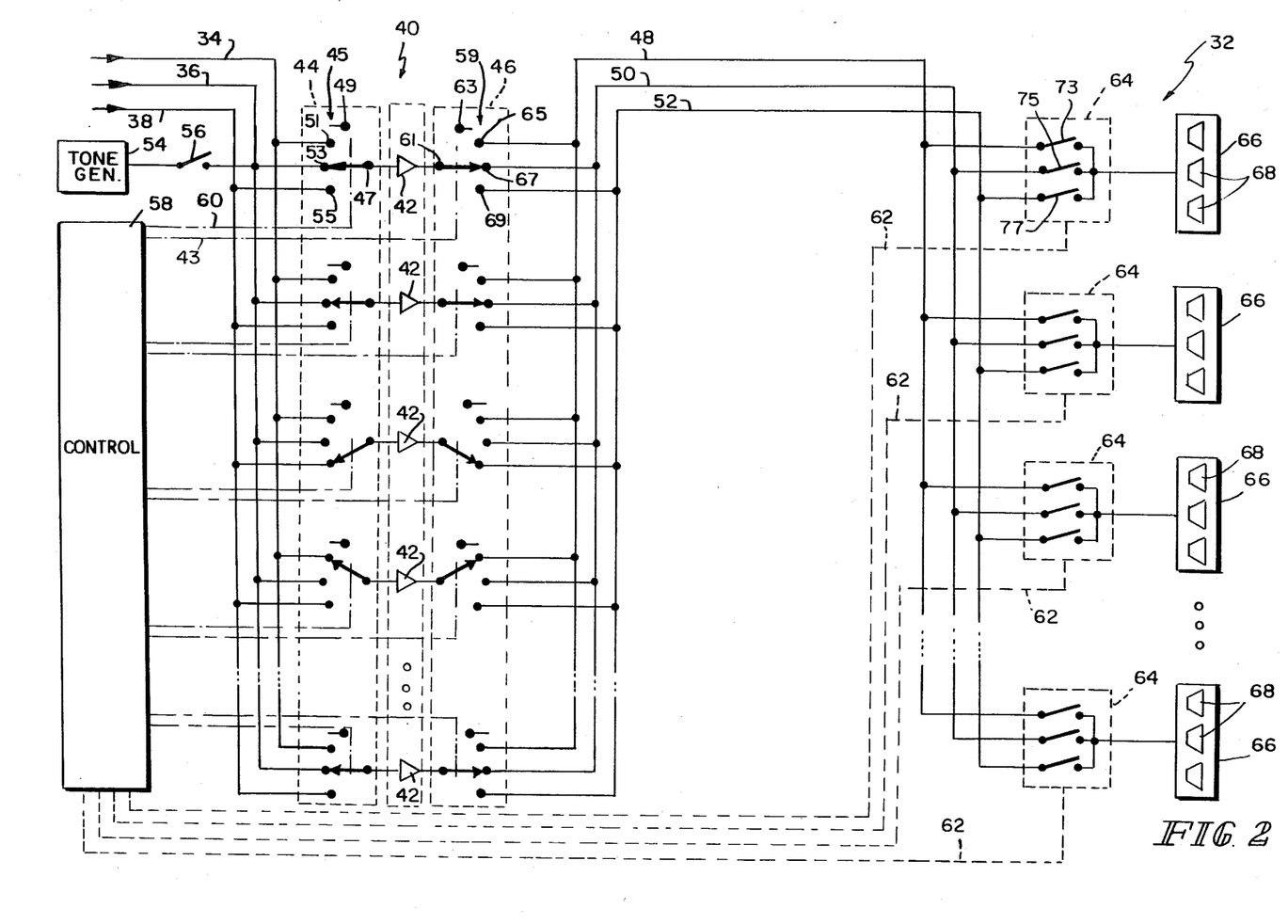
FIG. 2 is a block diagram of an audio annunciator system constructed in accordance with this invention.

Referring to FIG. 2, a block diagram of an audible annunciator system constructed in accordance with this invention is shown. An enunciator system 32 includes audio input channel 34, audio input channel 36 and audio input channel 38. Illustratively, audio input channel 34 is coupled to a tone source, audio input channel 36 is connected to a source of live voice, such as a microphone, and audio input channel 38 is connected to a source of pre-recorded voice messages, such as a tape recorder.

Annunciator system 32 also includes an audio amplifier bank 40 having a plurality of amplifiers 42. Each amplifier 42 has an input which is coupled to an output of an input channel switch bank 44. Illustratively, input channel switch bank 44 includes means for coupling the input of each amplifier 42 to any one of audio input channels 34, 36, 38. This is diagrammatically shown as a four position selector switch 45 having a common terminal 47 connected to the input of amplifier 42, a terminal 49 which is left open, a terminal 51 which is connected to input channel 34, a terminal 53 which is connected to input channel 36, and a terminal 55 which is connected to input channel 38. Switch 45 is illustratively controlled by a controller 58 which is coupled to switch 45 by control line 60.

The output of each amplifier 42 of amplifier bank 40 is connected to an input of output channel selector 46. Output channel selector 46 includes means for selectively coupling the output of each amplifier 42 of amplifier bank 40 to one of the output channels 48, 50, 52. The output channel selector for each amplifier 42 is illustratively shown as a four position selector switch 59 having a common terminal 61 coupled to the output of amplifier 42, a terminal 63 left open, a terminal 65 connected to output channel 48, a terminal 67 connected to output channel 50, and a terminal 69 connected to output channel 52. Switch 59 is illustratively controlled by controller 58 to which it is coupled by a control line 43. Annunciator system 32 also includes a tone generator 54 which is selectively coupled to input channel 36 such as by switch 56.

Audio output channels 48, 50, 52 are each coupled to an input of a speaker bank selector such as switch 64. Each switch 64 is coupled to a speaker bank 66 and selectively couples that speaker bank to output audio channels 48, 50, 52. Illustratively, the annunciator system 32 includes a plurality of speaker banks 66 wherein each speaker bank 66 includes at least one speaker 68.

As shown diagrammatically in FIG. 2, switch 64 includes three single-pole, single-throw switches 73, 75, 77. One side of switch 73 is connected to audio output channel 48 and the other side of switch 73 is connected to a speaker bank 66. One side of switch 75 is connected to audio output channel 50 and the other side of switch 75 is connected to the same speaker bank 66. One side of switch 77 is connected to audio output channel 52 and the other side of switch 77 is connected to the same speaker bank 66. Switches 73, 75, 77 are illustratively shown controlled by control line 62 from controller 58.

Figure 3:
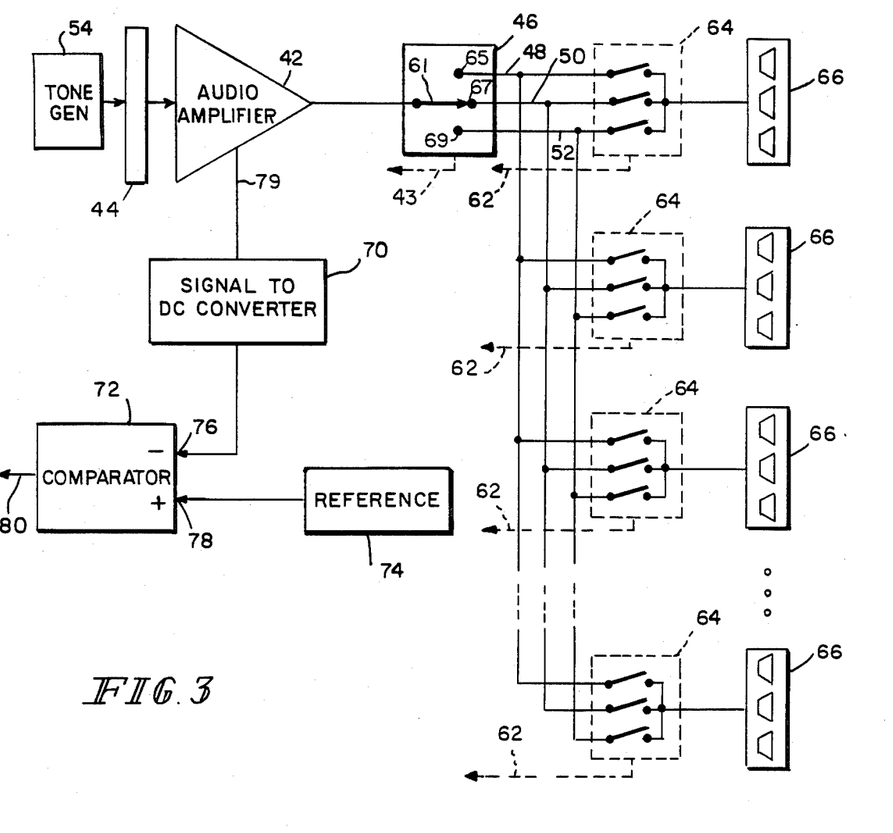
FIG. 3 is a block diagram of a portion of the embodiment of this invention shown in FIG. 2.

Referring to FIG. 3, a single amplifier 42 of amplifier bank 40 (not shown) is shown connected in the system in greater detail. Tone generator 54 is coupled, such as by switch 56 (FIG. 2) and input channel selector 44 (FIG. 2) to the input of amplifier 42. The output of amplifier 42 is coupled through output channel selector 46 to one of output channels 48, 50, 52. Each output channel 48, 50, 52 is, as discussed previously, coupled through switches 64 to one or more of speaker banks 66.

An output signal 79 of amplifier 42, which is representative of the power being generated by amplifier 42, is coupled to a signal-to-DC converter 70. Converter 70 converts the sinusoidal output signal 79 of amplifier 42 to a DC voltage indicative of the power being generated by amplifier 42. The output of converter 70 is coupled to the negative input 76 of comparator 72. A voltage reference developed by voltage reference generator 74 is coupled to a positive input 78 of comparator 72. An output 80 of comparator 72 comprises the status line for this particular amplifier 42 and is coupled to controller 58 (FIG. 2).

Figure 4:
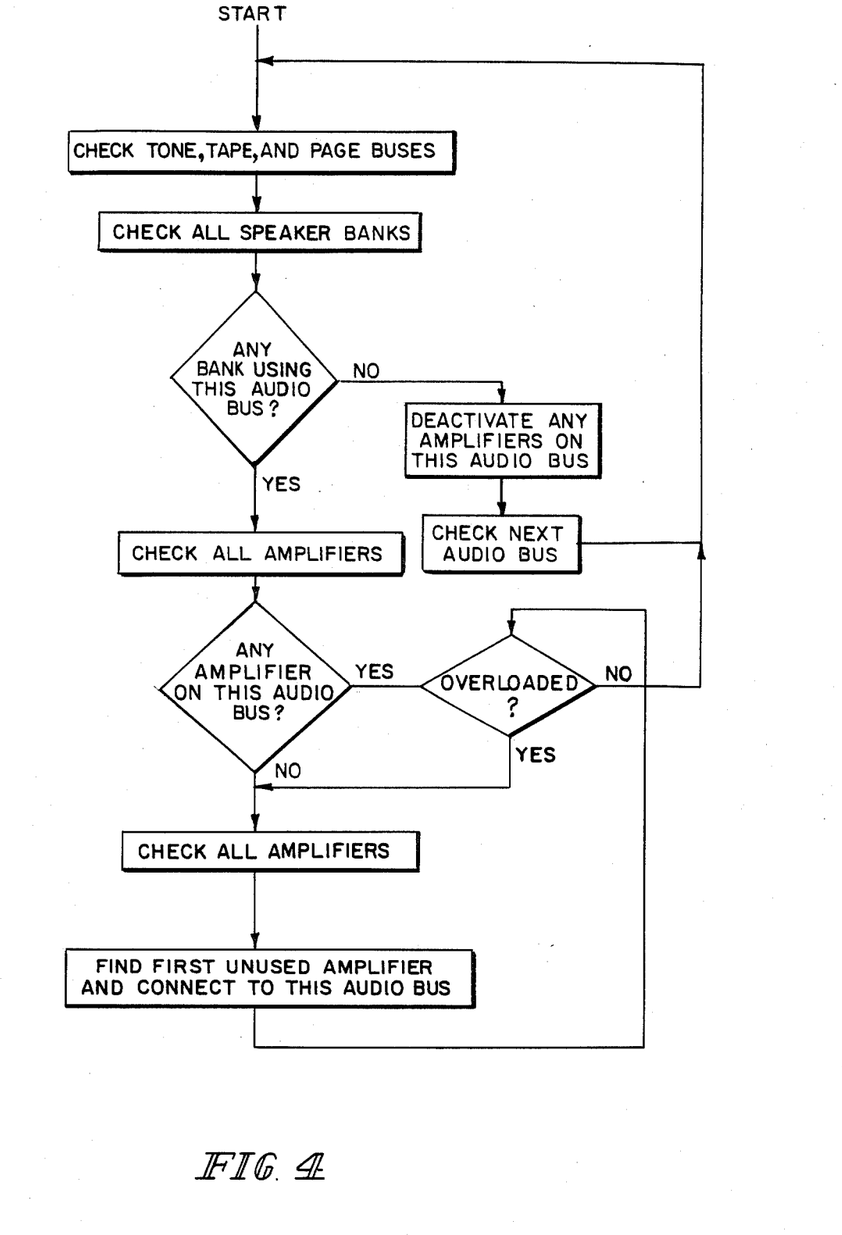
FIG. 4 is a flow chart showing the operational steps of a system constructed in accordance with this invention.

Referring to FIG. 4, a flow chart illustrating the operational sequence of an annunciator constructed in accordance with this invention is shown. At the start of the sequence, controller 58 (FIG. 2), which is illustratively a microprocessor or microcomputer, selects one of the three audio buses to be checked. Illustratively, the three audio buses comprise a tone bus made up of audio input channel 34 (FIG. 2) and audio output channel 48 (FIG. 2), a page bus made up of audio input channel 36 (FIG. 2) and audio output channel 50 (FIG. 2), and a tape bus made up of audio input channel 38 (FIG. 2) and audio output channel 52 (FIG. 2).

Next, controller 58 checks each speaker bank 66 (FIG. 2) to determine whether it was connected to the bus being checked, that is, whether it is connected to the audio output channel 48, 50, 52 corresponding to that bus. A speaker bank 66 is connected to an audio output channel 48, 50, 52 when controller 58 determines that the particular speaker bank 66 needs to be stimulated with one of the three audio sources. This could be due to an alarm condition occurring or an operator deciding to broadcast a page in a particular area. If no speaker bank is supposed to be using the audio bus being checked, all of the amplifiers which were connected to the audio output channel 48, 50, 52 corresponding to the audio bus being checked are decoupled from that audio output channel 48, 50, 52. Controller 58 then selects the next audio bus to be checked and repeats the procedure described above.

Once controller 58 determines that one or more speaker banks 66 are coupled to the audio output channel 48, 50, 52 of the particular bus being checked, it next causes each amplifier 42 of amplifier bank 40 to be checked. Controller 58 illustratively maintains status codes for each of the amplifiers 42 which indicate which amplifiers 42 are connected to which audio bus, that is, which amplifiers 42 are connected to which audio input channels 34, 36, 38 and to audio output channels 48, 50, 52. If controller 58 determines that an amplifier 42 is connected to the audio bus being checked, it next determines if the audio amplifier is overloaded as will be described in detail later. If the amplifier 42 is not overloaded, controller 58 returns to the point where it selects the next bus to be checked.

If controller 58 determines that the amplifier 42 is overloaded, it next checks all the amplifiers again to find an unused one. Once it finds an unused one, it connects it to the audio bus and returns to the point where it checks to see if the amplifier is overloaded. Also, if controller 58 determines that no amplifier was connected to the audio bus at the point where it checked for this, it would then step to the point of checking all of the amplifiers to find an unused one and connecting the first unused one to the audio bus.

In an embodiment, each audio bus is configured with the proper number of amplifiers for the speaker banks 66 which are coupled to the audio bus before the next audio bus is checked. This is done by checking each amplifier for an overload condition as it is added to the audio bus. In the following description, referring to FIG. 2, audio input channel 36 and audio output channel 50 will comprise the audio bus in question for the purpose of illustration.

At the beginning of the sequence, all speaker banks 66 will be disconnected from audio output channels 48, 50, 52. Tone generator 54 will be connected to input audio channel 36, such as by a switch 56, which will be connected to an amplifier 42 by input channel selector 44. Tone generator 54 provides a reference tone for stimulating audio amplifier 42 as best shown in FIG. 3. The output of audio amplifier 42 is coupled through output channel selector 46 to output channel 50. As mentioned, no speaker bank 66 has been coupled to output channel 50 at this time.

A first speaker bank 66 is now coupled through a switch 75 to output audio channel 50. This first speaker bank 66 will load amplifier 42 causing its power output to increase. Therefore, the signal 79 coupled to the input of signal-to-DC converter 70 will increase in amplitude. Signal-to-DC converter 70 will therefore produce at its output an increased DC voltage indicative of this increased power output of amplifier 42. Comparator 72 will compare the signal from converter 70 at its negative input 76 to the reference signal from reference generator 74 at its positive input 78. Provided the signal at negative input 76 is less than the signal at positive input 78, the output of comparator 72 will be high so that the signal on status line 80 will indicate that amplifier 42 has not yet been overloaded.

At this point, a second speaker bank 66 is connected to audio output channel 50 which further loads amplifier 42 causing it to increase its power output. Therefore, the signal 79 proportional to the power output of amplifier 42 will increase in magnitude which causes converter 70 to increase the magnitude of its DC output signal. Again, comparator 72 will compare the signal from converter 70 at its negative input 76 to the reference signal at its positive input 78 and set status line 80 appropriately.

Speaker banks 66 will continue to be added to audio channel 50 and the status of amplifier 42 will continue to be checked until amplifier 42 reaches an overload condition. When this happens, signal 79 causes converter 70 to generate a DC signal which is greater than the reference signal at positive input 78 of comparator 72. Comparator 72 will then bring status line 80 low, indicating that amplifier 42 has reached an overload condition. When this happens, controller 58 searches for an unused amplifier and connects it to the audio bus being configured, that is, it connects the input of the additional amplifier 42 to the tone generator 54 and the output of the amplifier 42 to audio output channel 50.

Controller 58 then causes speaker banks 66 to continue to be added to output channel 50 until the second amplifier 42 reaches an overload condition. At this point, controller 58 will add another amplifier 42 to the bus and will continue adding speaker banks 66 and amplifiers 42 until the last speaker bank 66 selected to be added to audio output channel 50 has been coupled to audio output channel 50. At this point, the audio bus in question will have been configured and will have only enough amplifiers 42 connected to stimulate the speaker banks 66 which are connected to audio output channel 50. Therefore little or no excess amplifier capacity will be wasted. Controller 58 then repeats the same procedure for the other audio buses. Once this is done, the appropriate amplifiers 42 and speaker banks 66 are connected to the audio input channel 34, 36, 38 and audio output channel 48, 50, 52 which comprise the audio bus to which they were configured.

Figure 5A:
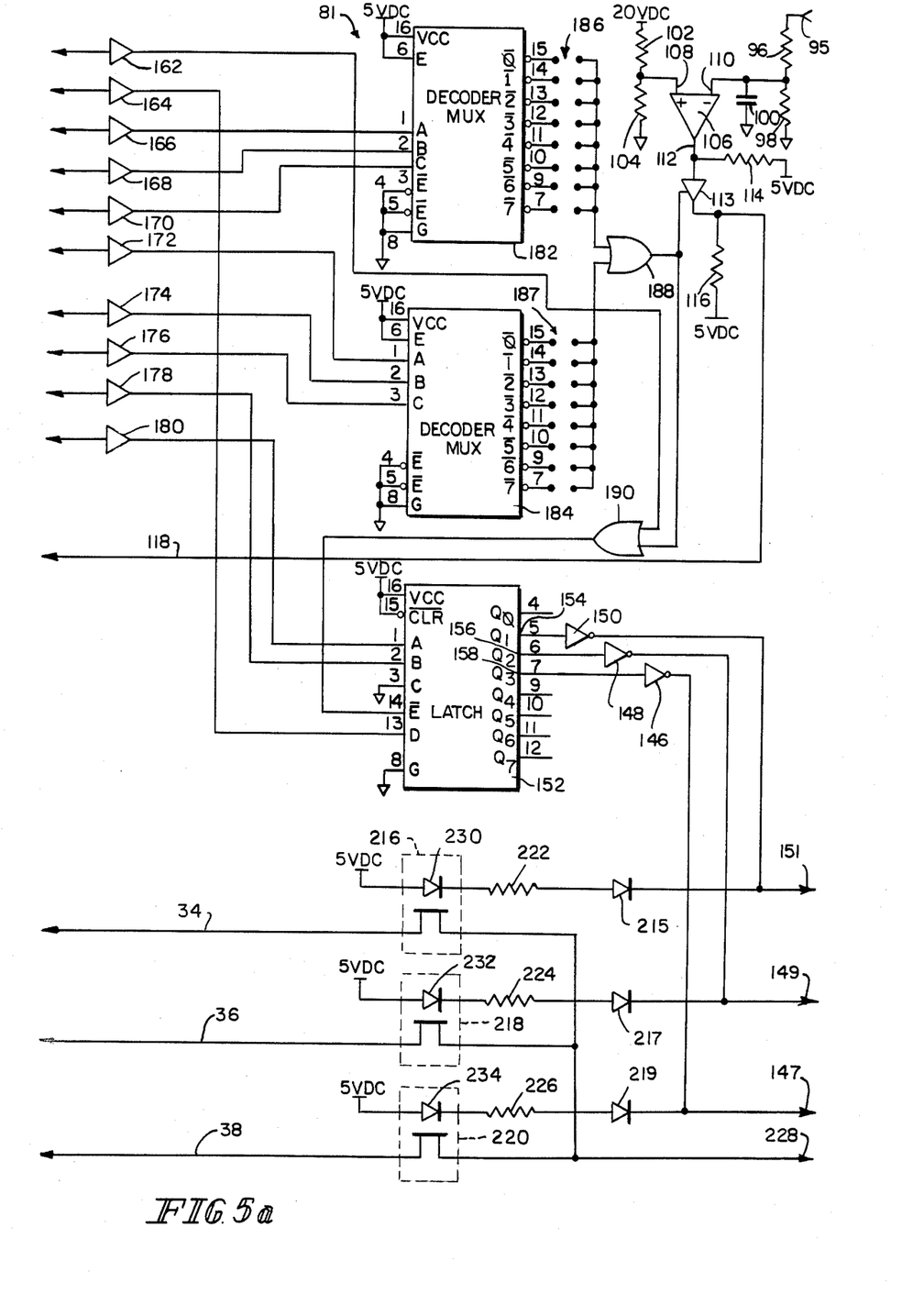
FIG. 5a is a schematic of a circuit of this invention.
Figure 5B:
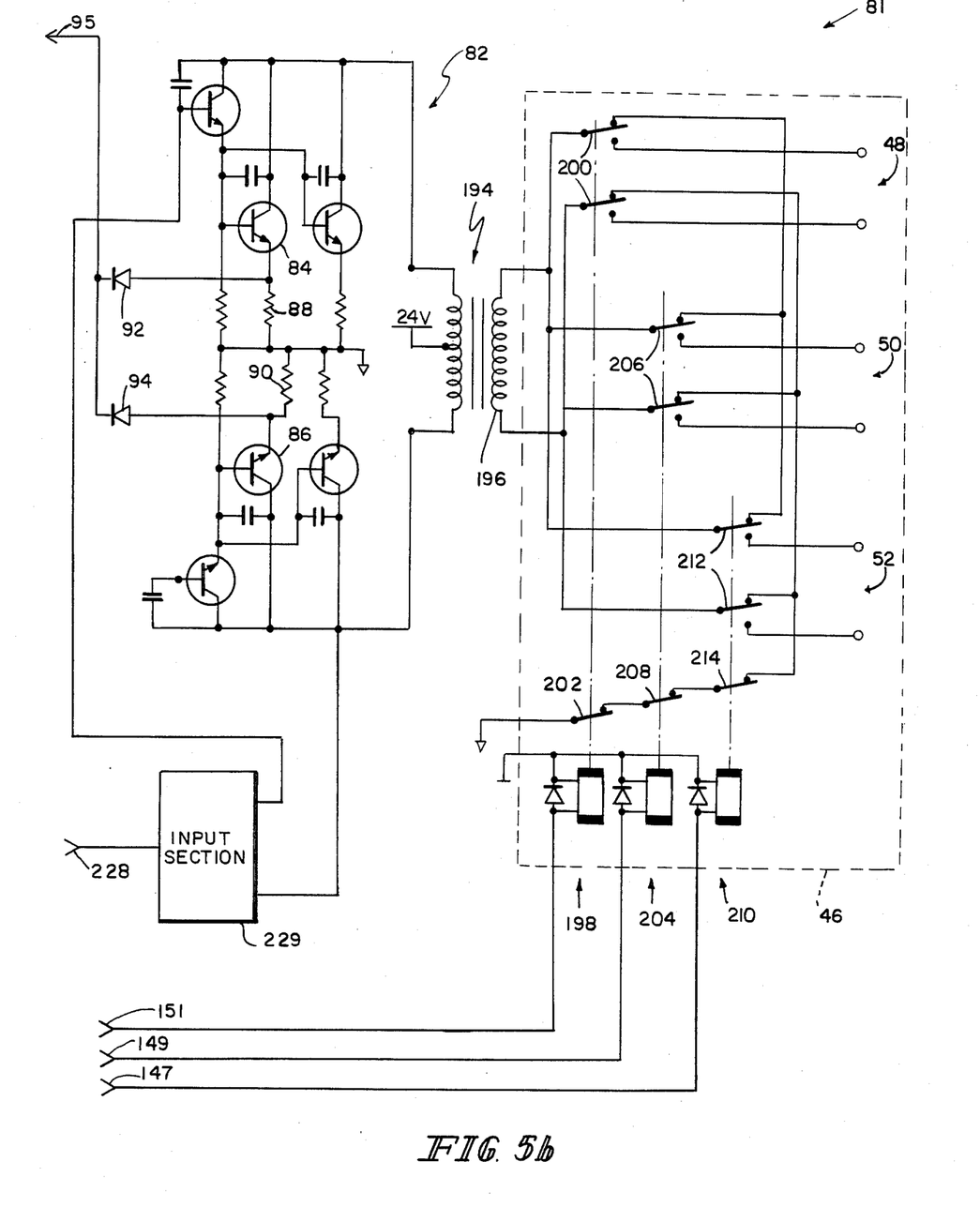
FIG. 5b is a schematic of a circuit of this invention.

Referring to FIGS. 5a and 5b, a circuit schematic of an audio amplifier card 81 of this invention is shown. Audio amplifier card 81 includes a push-pull power amplifier 82 (FIG. 5b) of which only the back end or power end is shown. Power amplifier 82 has power transistors 84, 86. The emitter of power transistor 84 is coupled to ground through a power resistor 88 and the emitter of power transistor 86 is coupled to ground through power resistor 90. Illustratively, power resistors 88, 90 are 0.15 ohm power resistors.

The anode of a diode 92 is connected to the junction between the emitter of power transistor 84 and power resistor 88, and the anode of a diode 94 is connected to the junction between the emitter of power transistor 86 and power resistor 90. The cathodes of diodes 92, 94 are connected together at node 95. Diodes 92, 94 half-wave rectify the sinusoidal signal developed by amplifier 82 which is proportional to the power output of amplifier 82. The magnitude of the current flowing through power transistors 84, 86 is proportional to the power output of amplifier 82. A voltage is developed across power resistors 88, 90 which is half-wave rectified by diodes 92, 94 to provide a half-wave rectified sinusoid at node 95 having a magnitude indicative of the power output of amplifier 82.

Node 95 is connected through resistor 96 to a negative input 110 of comparator 106. Capacitor 100 and resistor 98 are also connected to the negative input 110 of comparator 106. Resistors 96, 98 and capacitor 100 average the half-wave rectified sinusoid at node 95 to produce at negative input 110 of comparator 106 a DC voltage indicative of the power output of amplifier 82. Illustratively, amplifier 82 has a rated power output of 100 watts and the voltage developed at the anodes of diodes 92, 94 will have a peak of 1 volt.

A voltage divider network comprising resistors 102 and 104 is connected between a DC voltage source, illustratively 20 volts DC, and ground. The junction of resistors 102, 104 is connected to the positive input 108 of comparator 106 to provide a reference voltage for comparator 106. The output of comparator 106 is connected through pull-up resistor 114 to a source of +5 volts DC and to the input of a tri-state buffer 113. The output of buffer 113 is coupled through a pull-up resistor 116 to the 5VDC source and is also connected to the status line 118 of controller 58 (not shown) which is illustratively a microprocessor. Controller 58 is illustratively coupled to audio amplifier card 81.

Three address lines from controller 58 are coupled through buffers 166, 168, 170 to inputs of 8 bit decoder/multiplexer 182. Three other output address lines from controller 58 are coupled through buffers 172, 174, 176 to inputs of 8 bit decoder/multiplexer 184. Two additional address lines from controller 58 are coupled through buffers 178, 180 to inputs of 8 bit address latch 152. Illustratively, the six address lines from controller 58 coupled through buffers 166, 168, 170, 172, 174, 176 to the inputs of decoder/multiplexers 182, 184 are the six most significant address lines from controller 58 and the two address lines coupled through buffers 178, 180 to the inputs of 8 bit address latch 152 are the two least significant address lines from controller 58. The decoder/multiplexers 182, 184 are illustratively 74LS138 integrated circuits and address latch 152 is a 74LS259 integrated circuit, which are all available from Texas Instruments, Incorporated, Dallas, Tex. 75222.

Decoder/multiplexer 182 translates the signals at its three inputs into 8 outputs wherein one of the 8 outputs will be low and the rest will be high. Decoder/multiplexer 184 will do the same for the signals at its inputs. An appropriate output of decoder/multiplexer 182 is coupled to an input of OR gate 188 through jumper matrix 186 and an appropriate output of decoder/multiplexer 184 coupled through jumper matrix 187 to a second input of OR gate 188. An appropriate output from each of decoder/multiplexers 182, 184 is coupled to the first and second inputs of OR gate 188, respectively, by placing a jumper in the appropriate place in each jumper matrix 186, 187. The address of the amplifier card 81 is determined by which one of the outputs of decoder multipliers 182, 184 is connected to the respective first and second inputs of OR gate 188. Therefore, the amplifier card 81 will respond only when controller 58 generates an address on its six most significant address outputs which corresponds to the address selected by the jumpers placed in jumper matrices 186, 187.

The output of OR gate 188 is coupled to the tri-state input of buffer 113 and to a first input of OR gate 190. A second input of OR gate 190 is coupled to an enable output of controller 58 through buffer 162. The output of OR gate 190 is coupled to an enable input of address latch 152. A data input of address latch 152 is coupled to a data output of controller 58 through buffer 164.

An output 154 of address latch 152 is coupled through inverter 150 to node 151. The cathode of a diode 215 and the coil of a relay 198 are also connected to node 151. A second output 156 of address latch 152 is coupled through inverter 148 to node 149. The cathode of a diode 217 and the coil of a relay 204 are also connected to node 149. A third output 158 of address latch 152 is coupled through inverter 146 to node 147. The cathode of a diode 219 and the coil of a relay 210 are also connected to node 147. Relays 198, 204, 210 comprise a portion of output channel selector 46 (FIG. 2) which selects the output channel 48, 50, 52 to which amplfier 82 will be connected.

Audio input channel 34 is coupled to an input of optically energized transmission gate 216. An output of optically energized transmission gate 216 is coupled to an input 228 of input section 229 of amplifier 82. Audio input channel 36 is coupled to an input of optically energized transmission gate 218 and an output of opitically energized transmission gate 218 is coupled to input 228 of input section 229 of amplifier 82. Audio input channel 38 is coupled to an input of optically energized transmission gate 220 and an output of optically energized transmission gate 220 is coupled to input 228 of input section 229 of amplifier 82. Illustratively, optically energized transmission gates 216, 218, 220 are H11F3 photon coupled field-effect transistors available from General Electric Co., Semiconductor Dept., in Auborn, N.Y.

Optically energized transmission gate 216 has a light emitting gate diode 230 having its anode connected to 5 VDC and its cathode coupled through resistor 222 to the anode of diode 215. Optically energized transmission gate 218 has a light emitting gate diode 232 having its anode coupled to 5 VDC and its cathode coupled through resistor 224 to the anode of diode 217. Optically energized transmission gate 220 has a light emitting gate diode 234 having its anode coupled to 5 VDC and its cathode coupled through resistor 226 to the anode of diode 219.

Amplifier 82 is illustratively a transformer coupled push-pull audio power amplifier having a transformer 194 which couples the output of amplifier 82 to audio output channel selector 46. Audio output channel selector 46 illustratively comprises, for each amplifier card 81, relays 198, 204, 210. Relay 198 includes double-pole contacts 200 which couple each side of secondary 196 of transformer 194 to audio output channel 48. Relay 204 includes double-pole contacts 206 which couple each side of the secondary 196 of transformer 194 to audio output channel 50. Relay 210 includes double-pole contacts 212 which couple each side of secondary 196 of transformer 194 to audio output channel 52. Relays 198, 204, 210 also include single-pole contacts 202, 208, 214, respectively, which, when relays 198, 204, 210 are all deenergized, couple one side of secondary 196 of transformer 194 to ground.

When decoder/multiplexers 182, 184 receive the proper address from controller 58, the outputs of decoder/multiplexers 182, 184 which are coupled through jumper matrices 186, 187 to the first and second inputs of OR gate 188, respectively, will go low. This causes the output of OR gate 188 to go low which enables buffer 113. Further, the input of OR gate 190 which is coupled to the output of OR gate 188 will also be low.

When controller 58 generates an enable pulse on the enable line, which will be a low going pulse, the output of OR gate 190 will go low causing the enable input of 8 bit address latch 152 to be strobed low. Prior to this, the address outputs from controller 58 which are coupled through buffers 178, 180 to the inputs of 8 bit address latch 152 will have taken on the proper states to select the appropriate input audio channel 34, 36, 38 which will be coupled to the input 228 of input section 229 of amplifier 82. Upon receipt of the enable pulse at OR gate 190, address latch 152 will latch one of outputs 154, 156, 158 high.

The appropriate inverter 146, 148, 150 will invert the high output of address latch 152 to produce a low signal at the cathode of the appropriate diode 215, 217, 219. Assuming audio input channel 36 has been selected to be connected to the input 228 of input section 229 of audio amplifier 82, output 156 of address latch 152 will be high. Inverter 148 will invert the high signal produced by output 156 to generate a low signal at the cathode of diode 217. This couples the light emitting gate diode 232 of optically energized transmission gate 218 to ground through resistor 224 causing diode 232 to be energized. This turns optically energized transmission gate 218 on, coupling audio input channel 36 to the input 228 of input section 229 of audio amplifier 82. At the same time, a low at the cathode of diode 217 will also pull one side of the coil of relay 204 to ground, energizing relay 204, which causes contacts 206 to connect both sides of secondary 196 of transformer 194 to the positive and negative sides of audio output channel 50.

After audio input channel 36 and audio output channel 50 have been connected to amplifier 82, controller 58 will cause speaker banks 66 (FIG. 2) to be sequentially connected to audio output channel 50. As each speaker bank 66 is connected to output audio channel 50, the load on amplifier 82 will increase. This will cause the magnitude of the current flowing through power resistors 88 and 90 of amplifier 82 to increase. Therefore, the magnitude of the sinusoidal signal generated at the anode of diodes 92, 94 will also increase. This, in turn, causes the magnitude of the half-wave rectified sinusoid at the cathodes of diodes 92, 94 to increase. Capacitor 100 averages the half-wave rectified sinusoid at the cathodes of diodes 92, 94 to produce a DC voltage at the negative input 110 of comparator 106. Therefore, as the load on amplifier 82 is increased by adding additional speaker banks 66 to audio output channel 50, the DC voltage at negative input 110 of comparator 106 will increase proportionally.

When the DC voltage at negative input 110 of comparator 106 exceeds the DC voltage at positive input 108 of comparator 106, illustratively 1 VDC, the output 112 of comparator 106 will go low. This causes the output of buffer 113 to go low which bring status line 118 of controller 58 low. Controller 58 senses that status line 118 has gone low which indicates that amplifier 82 has reached the point that it is producing its rated power output. Therefore, controller 58 will switch an additional amplifier 82 to audio input channel 36 and audio output channel 50 and begin the same procedure of sequentially switching speaker banks 66 onto audio output channel 50 and checking to determine if the additional amplifier 82 has reached the point of being overloaded.

Illustratively, when the audio busses are being configured, all speaker banks 66 will be disconnected from the audio output channels 48, 50, 52 and the audio input channels 34, 36, 38 will be disconnected from the inputs of the amplifiers 42 (FIG. 2). Once controller 58 determines that an audio signal needs to be transmitted to one or more speaker banks 66, it selects those speaker banks 66 to be stimulated. Controller 58 then selects a first amplifier card 81. The live voice channel, illustratively audio input channel 36, will be connected to the input of amplifier 82 (FIG. 5) and output channel 50 will be connected to the output of amplifier 82. Tone generator 54 (FIG. 2) will be connected to audio input channel 36.

Controller 58 now connects a first of the selected speaker banks 66 to audio output channel 50 and uses tone generator 54 to stimulate amplifier 82 with a tone burst. Amplifier card 81 senses the load on amplifier 82 and sets the status line 118 low if amplifier 82 is overloaded. Otherwise, status line 118 remains high. Assuming amplifier 82 is not overloaded, the next selected speaker bank 66 is connected to audio output channel 50 and amplifier 82 again stimulated with a tone burst to determine if it is overloaded. Controller 58 continues to add selected speaker banks 66 to audio output channel 50 until amplifier 82 reaches the point of being loaded. Amplifier card 81 then pulls the status line 118 low which signals controller 58 that amplifier 82 has reached its overload point.

Controller 58 will now cause a second amplifier card 81 with its amplifier 82 to be connected to audio input channel 36 and audio output channel 50. The first amplifier card 81 and its amplifier 82 remain connected to audio input channel 36 and audio output channel 50. Controller 58 will then add additional selected speaker banks 66 until the amplifiers 82 reach the point of being overloaded. Controller 58 will then cause an additional amplifier card 81 and its amplifier 82 to be added. This continues until all the selected speaker banks have been connected to audio output channel 50.

When this occurs, controller 58 marks the amplifier cards 81 which it has connected as being in use and then causes the amplifier cards 81 and the selected speaker banks 66 to be disconnected. Controller 58 then configures the next audio bus in the same manner. Once all the audio busses have been configured, controller 58 causes the appropriate amplifier cards 81 and the selected speaker banks 66 to be connected to the appropriate audio input channels 34, 36, 38 and the appropriate audio output channels 48, 50, 52.

Although the invention has been described in detail with reference to certain preferred embodiments and specific examples, variations and modifications exist within the scope and spirit of the invention as described and as defined in the following claims.

What is claimed is:

1. A proportional audio power demand system comprising a plurality of speaker banks, each speaker bank having at least one speaker, at least one audio channel, a plurality of amplifiers, amplifier coupling means for selectively coupling each amplifier to the channel, speaker bank coupling means for selectively coupling each speaker bank to the channel, control means for controlling the amplifier coupling means and the speaker bank coupling means to cause at least one amplifier and one speaker bank to be coupled to the channel, means for sensing the power output of the amplifier, means for coupling the sensing means to the control means and to the amplifier, means for coupling the amplifier coupling means to the control means, and means for coupling the speaker bank coupling means to the control means, the control means including means for causing the speaker bank coupling means to sequentially couple one or more speaker banks to the channel and for determining, after each speaker bank has been coupled, whether to couple an additional amplifier to the channel based upon the sensed audio power, and for causing said amplifier coupling means to couple said additional amplifier if so determined.

2. The system of claim 1 and further including a tone generator, means for coupling the tone generator to one or more of the amplifiers, and the power output sensing means including means for sensing the power output when the one or more amplifiers coupled to the channel are stimulated with a reference tone signal generated by the tone generator.

3. The system of claim 1 and further including a plurality of audio channels, the control means including means for selecting which of the speaker banks is to be coupled to which channel and to cause the amplifier coupling means to couple an amplifier to the first one of the selected channels and to cause the speaker bank coupling means to sequentially couple selected speaker banks to the first one of the selected channels, the control means including means for deciding to couple an additional amplifier to the channel based upon the sensed power output after each speaker bank is coupled to the channel, and continuing to add speaker banks and deciding to add additional amplifiers based upon sensed power output after each speaker bank is added until all the speaker banks selected for the first one of the selected channels have been coupled to that channel, the control means repeating the sequence of sequentially causing the speaker banks selected for that channel to be coupled to that channel and deciding to cause an additional amplifier to be coupled to that channel after each of the selected speaker banks is coupled to that channel until all speaker banks selected for that channel have been coupled to that channel for all the selected channels.

4. A proportional audio power demand system comprising a plurality of amplifiers, a plurality of speaker banks, a plurality of audio channels, means for selectively coupling each amplifier to each channel, means for selectively coupling each speaker bank to each channel, means for sensing the power output of each amplifier, a tone generator, means for selectively coupling the tone generator to each amplifier, control means for controlling the system comprising means for selecting which of the channels is to be used to broadcast audio-message signals, means for configuring each of the selected channels comprising means for causing the amplifier coupling means to couple an amplifier to one of the selected channels and for causing the speaker bank coupling means to sequentially couple the selected speaker banks of the selected channel, means for determining when to cause an additional amplifier to be coupled to the selected channel based upon the power output of the amplifiers coupled to the selected channel after each of the speaker banks selected to be coupled to the selected channel is coupled to the selected channel, the configuring means configuring each of the selected channels.

5. A proportional audio power demand system comprising a plurality of speaker banks, each speaker bank having at least one speaker, at least one audio channel, a plurality of amplifiers, tone generator means for providing a reference tone to one or more of said amplifiers, amplifier coupling means for selectively coupling each amplifier to the channel, speaker bank coupling means for selectively coupling each speaker bank to the channel, control means for controlling the amplifier coupling means and the speaker bank coupling means to cause one or more amplifiers and one or more speaker banks to be coupled to the channel, means for sensing the power output of the amplifier, means for coupling the sensing means to the control means and to the amplifier, means for coupling said tone means to said control means, means for coupling the amplifier coupling means to the control means, and means for coupling the speaker bank coupling means to the control means, the control means including means for determining when to cause the amplifier coupling means to couple an additional amplifier to the channel based upon the sensed audio power when the one or more amplifiers coupled to the channel are stimulated with a reference tone signal generated by said tone generator means.

6. A proportional audio power demand system comprising a plurality of speaker banks, each speaker bank having at least one speaker, a plurality of audio channels, a plurality of amplifiers, amplifier coupling means for selectively coupling each amplifier to said channels, speaker bank coupling means for selectively coupling each speaker bank to said channels, control means for controlling the amplifier coupling means and the speaker bank coupling means, means for sensing the power output of at least one of the amplifiers, means for coupling the sensing means to the control means and to at least one of the amplifiers, means for coupling the amplifier coupling means to the control means, and means for coupling the speaker bank coupling means to the control means, the control means including: means for selecting which of the speaker banks is to be coupled to which channel; and configuration means for configuring said channels, said configuration means including means for causing said amplifier coupling means to couple an amplifier to a first one of the selected channels, for causing said speaker bank coupling means to sequentially couple selected speaker banks to said first one of the selected channels, for deciding to couple an additional amplifier to said first channel based on the sensed power after each speaker bank is coupled to the channel, for causing said amplifier coupling means to couple the additional channel if so decided, for causing said speaker bank coupling means to continue to add speaker banks and said amplifier coupling means to continue to add additional amplifiers as decided based upon sensed power output after each speaker bank is added until all the speaker banks selected for said first one of the selected channels have been coupled to that channel, and for repeating the sequence of sequentially causing the speaker banks selected for each channel to the coupled to that channel, deciding whether to add an additional amplifier after each of the selected speaker banks for each channel have been coupled to that channel, and causing the amplifier coupling means to couple an additional amplifier if so decided, until all speaker banks selected for each channel have been coupled to that channel for all the selected channels.

* * * * *